United States Patent [19]
Rajeevakumar

[11] Patent Number: 5,529,944
[45] Date of Patent: Jun. 25, 1996

[54] METHOD OF MAKING CROSS POINT FOUR SQUARE FOLDED BITLINE TRENCH DRAM CELL

[75] Inventor: Thekkemadathil V. Rajeevakumar, Scarsdale, N.Y.

[73] Assignee: International Business Machines Corporation, Armonk, N.Y.

[21] Appl. No.: 383,137

[22] Filed: Feb. 2, 1995

[51] Int. Cl.$^6$ .............................................. H01L 21/8242
[52] U.S. Cl. ................... 437/52; 437/60; 437/162
[58] Field of Search .................. 437/47, 48, 52, 437/60, 162, 919; 257/302

[56] References Cited

U.S. PATENT DOCUMENTS

| | | | |
|---|---|---|---|
| 4,830,978 | 5/1989 | Teng et al. | 437/52 |
| 5,001,078 | 3/1991 | Wada | 437/52 |
| 5,008,214 | 4/1991 | Redwine | 437/52 |
| 5,013,680 | 5/1991 | Lowrey et al. | 437/52 |
| 5,014,099 | 5/1991 | McElroy | 357/23.6 |
| 5,066,607 | 11/1991 | Banerjee | 437/52 |
| 5,155,059 | 10/1992 | Hieda | 437/52 |
| 5,214,603 | 5/1993 | Dhong et al. | 365/207 |
| 5,216,266 | 6/1993 | Ozaki | 257/302 |

FOREIGN PATENT DOCUMENTS 2-144962  4/1990  Japan ........................... H01L 27/108

OTHER PUBLICATIONS

"A Trench Transistor Cross-Point Dram Cell" W. F. Richardson et al IEDM Technical Digest (1985) IEDM Conf. pp. 714–717.

*Primary Examiner*—Tom Thomas
*Attorney, Agent, or Firm*—Robert P. Tassinari, Jr.

[57] ABSTRACT

The invention is a high density cross point folded bitline trench DRAM cell with a cell area of only 4 lithographic squares. The access device (transfer device) is vertically disposed on the side of a trench. In a preferred embodiment, poly spacer wordlines are used. The width of the wordlines can be increased, without increasing the cell area, by increasing the depth of the shallow trench. This will result in faster cell access due to the lower RC time constant of the wordline. The diffusion contact to the storage node, as well as the access device, is placed on one side of the trench to minimize the interaction between adjacent nodes, especially with scaling. The cell has a simple topography, and uses only one level of bitline wiring.

6 Claims, 9 Drawing Sheets

METHOD OF MAKING CROSS POINT FOUR SQUARE FOLDED BITLINE TRENCH DRAM CELL

FIELD OF THE INVENTION

The invention relates to memory devices, and in particular to trench DRAM cells.

BACKGROUND OF THE INVENTION

As the DRAM cell is scaled towards the 1 Gb DRAM level and beyond, innovative cell concepts are needed to push the cell area to practical limits. For conventional folded bitline DRAM cells, the lithography-limited minimum cell area is 8 lithographic squares. Although conventional open bitline cells have a lithography-limited cell area of only 4 lithographic squares, folded bitline cells are preferred because of their inherently lower noise sensitivity. Thus, open bitline cells are usually not used in manufacturing, and therefore any practical method to further reduce the limiting cell area of the conventional folded bitline cell will be useful.

SUMMARY OF THE INVENTION

It is an object of the present invention to provide a folded bitline DRAM cell requiring significantly less area than prior art folded bitline cells.

It is a further object to provide a folded bitline DRAM cell requiring just four lithographic squares of area.

It ia a further object of the invention to provide a reduced-area folded bitline DRAM cell that does not suffer from the adverse effects of cross talk among adjacent wordlines.

In accordance with the above objectives, there is provided a method for fabricating a folded bitline trench DRAM cell, comprising the steps of: providing a substrate; etching a first trench and a second trench into the substrate, the trenches each having walls; lining the walls of the trenches with a dielectric material; partially filling the trenches with polysilicon; forming an insulating cap on the upper surface of the polysilicon in the trenches; removing a portion of the insulating cap adjacent the wall of each trench; forming first diffusion regions in the substrate proximate the removed portion of cap oxide; forming second diffusion regions near the surface of the substrate and adjacent the side of each trench proximate the removed portion of the insulating cap; forming a gate along the wall of each trench to connect the first and second diffusion areas associated with the respective trench; forming first and second wordlines on opposite walls of each of the trenches, one of the wordlines in each trench being disposed on the oxide spacer in each trench.

Also in accordance with the above objectives, there is provided a folded bit line trench DRAM cell, comprising: a substrate; a first trench in the substrate lined with a dielectric material and partially filled with polysilicon, the polysilicon having an upper surface covered by an insulating material, and a portion of the polysilicon protruding through the dielectric material and contacting the substrate; a first pair of wordlines disposed along the walls of the first trench above the insulating material; a first diffusion area proximate the surface of the substrate and adjacent the wall of the first trench through which the portion of polysilicon protrudes; a first access transistor disposed in the substrate along the wall of the first trench coupling the protrusion of polysilicon and the first diffusion area.

FIGURES

DETAILED DESCRIPTION

The invention is a high density cross point folded bitline trench DRAM cell with a cell area of only 4 lithographic squares. The access (transfer) device is vertically disposed on the side of a trench. In a preferred embodiment, poly spacer wordlines are used. The width of the wordlines can be increased, without increasing the cell area, by increasing the depth of the shallow trench. This will result in faster cell access due to the lower RC time constant of the wordline. The diffusion contact to the storage node, as well as the access device, is placed on one side of the trench to minimize the interaction between adjacent nodes. Otherwise, the interaction would become severe with scaling. The cell has a simple topography, and uses only one level of metal for bitline wiring.

Thus, the invention reduces the lithographic area of a DRAM cell by placing the wordlines vertically in an upper portion of the storage trenches of the cell, rather than lying the wordlines on the surface of the array. This allows compression of the area required for a given array by a factor of two. The present invention is also advantageous in that the access device for a given cell is disposed below the surface of the substrate, on a side of an associated trench opposite the side supporting the wordline of the cell, which allows the access device to be shielded from the access devices of adjacent cells, thus allowing scaling of the array.

Figure 1:
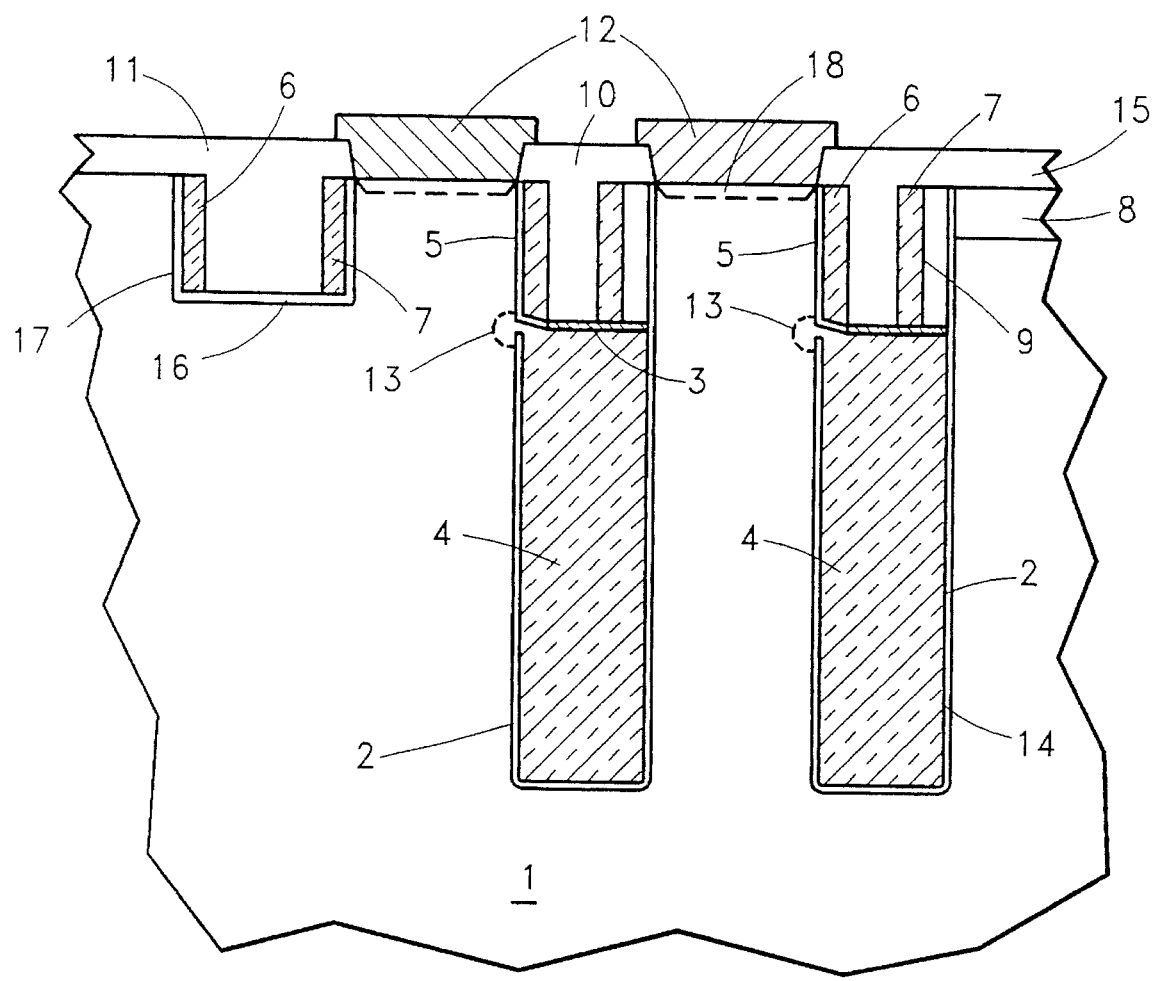
FIG. 1 is a schematic diagram of the vertical structure of a DRAM cell in accordance with the invention.

FIG. 1 shows a schematic vertical structure of a preferred embodiment of the folded bitline DRAM cell of the present invention. The structure of FIG. 1 includes a p+ substrate 1 into which a pair of trenches 2 are formed. Each trench capacitor includes a dielectric layer 14 lining the walls of the lower portion of the trench, and an internal polysilicon fill 4 inside the trenches. Vertical access devices 5 are disposed along the trench wall near the surface of the substrate. Wordlines 6 and passing wordlines 7 are disposed in each trench above the respective cap oxide 3. An oxide spacer 9 is disposed between the passing wordlines and the wall of the respective trench. LOCOS isolation layer 8, isolates adjacent cells from one another and oxide layers 10, 11 and 15 isolate bitlines 12 from one another. Storage node diffusion 13 is disposed adjacent the junction of wordline 6, cap 3 and fill 4. Shallow trench 16 provides a conduit through which wordlines 6 and 7 can pass between adjoining cells (as better seen in the plan view of FIG. 2). Shallow trench 16 is lined with oxide layer 17. Device diffusion region 18 is disposed on the surface of the substrate for the bitline contacts 12.

Figure 2:
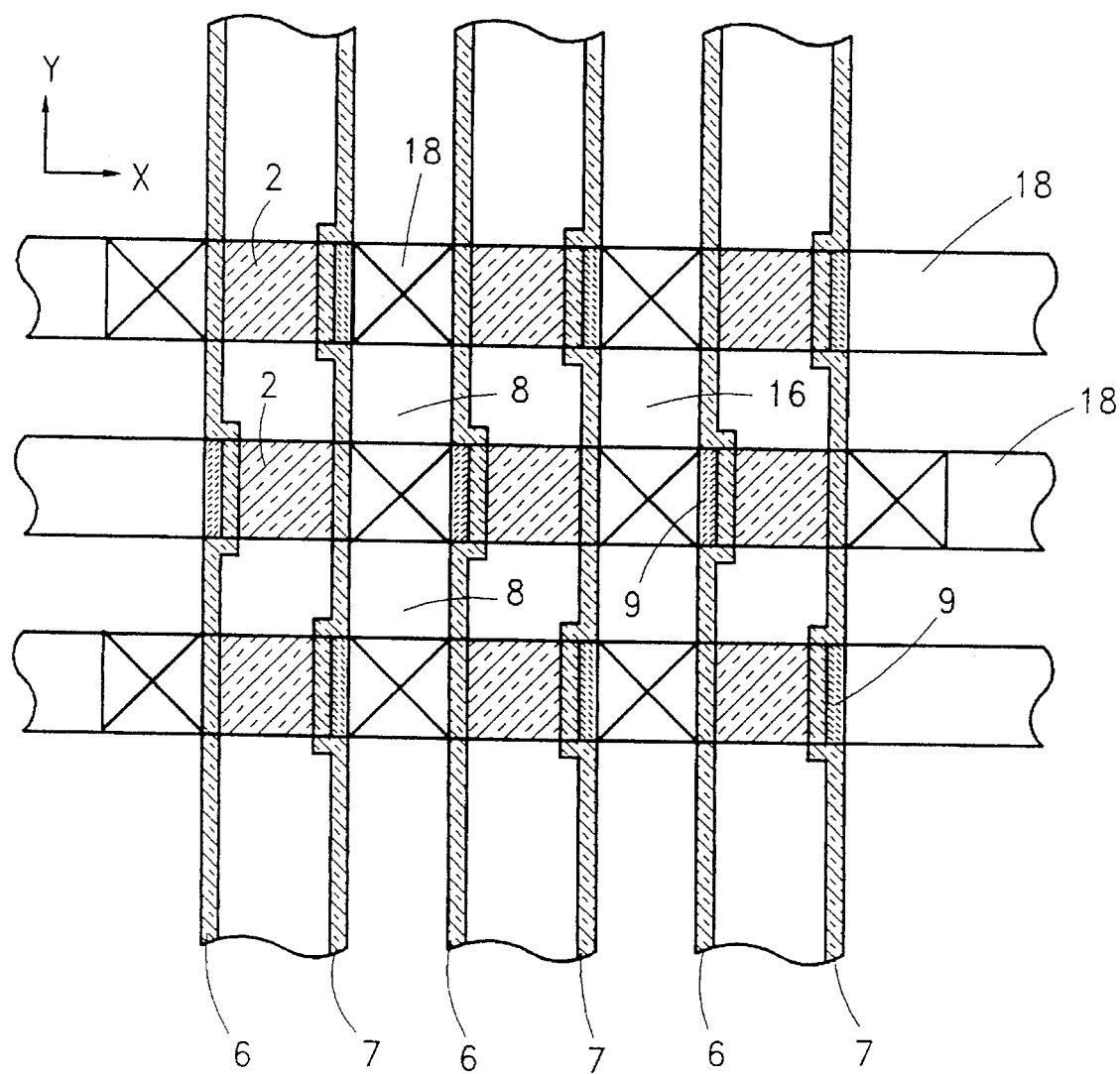
FIG. 2 is a plan view of the cell of FIG. 1.

Each vertical access device 5 is located on one side of an upper portion of an associated storage trench 2. The access transistor 5 and the storage node diffusion 13 are placed on one side of the storage trench to minimize any interaction between the access transistor and storage node associated with adjacent trenches. LOCOS 8 (or some other suitable isolation means) is disposed between the diffusion regions of each cell for isolation purposes. Wordlines 6 are formed of polysilicon. Wordlines may also be formed using a multi-layer stack, using polysilicon, silicide, and other suitable materials. The shallow trench 16 between adjacent pairs of storage trenches 2 provides a channel or conduit through which spacer wordlines can pass between storage trenches 2 of adjacent cells. Thus, the shallow trench assures the continuity of the spacer wordlines. FIG. 2 illustrates the positioning of shallow trenches 16 between trenches 2.

As shown in FIG. 1, the shallow trench 16 is lined with thick oxide 17 in order to isolate the wordlines passing therethrough from the substrate. An additional oxide spacer 9 is used in each of trenches 2 to isolate the passing wordline 7 from the trench sidewall. This is done to prevent the oxide on the walls of the upper portion of trenches 2 from forming access devices in the region covered by oxide 9. The cap oxide 3 isolates the wordlines 6 and 7 from the storage node poly fill 4 for the same reason. Deposited oxide 10, 11 and 15 acts as a filler to fill the space between wordline 6 and passing wordline 7.

FIG. 2 shows a plan view (layout) of the DRAM cell of FIG. 1. The plan view of FIG. 2 does not show all of the details of the structure of FIG. 1, to avoid confusion. In FIG. 2, the polysilicon spacer wordlines 6 and 7 are shown as running in the "y" direction, and bitlines 18 run in the "x" direction (with reference to the x-y coordinates shown in FIG. 2). Each bitline-to-diffusion contact is 12. The storage trenches are 2, the LOCOS isolation is 8, and the oxide spacer is 9. Each cell is placed so as to minimize cell-to-cell interaction and to thereby facilitate scaling. Only one level of bitline wiring is used. That is, the bitlines are not stacked above the surface of the substrate as in some prior devices.

A preferred method of fabricating the cell structure shown in FIGS. 1 and 2 is now described.

Process Details

Figure 3:
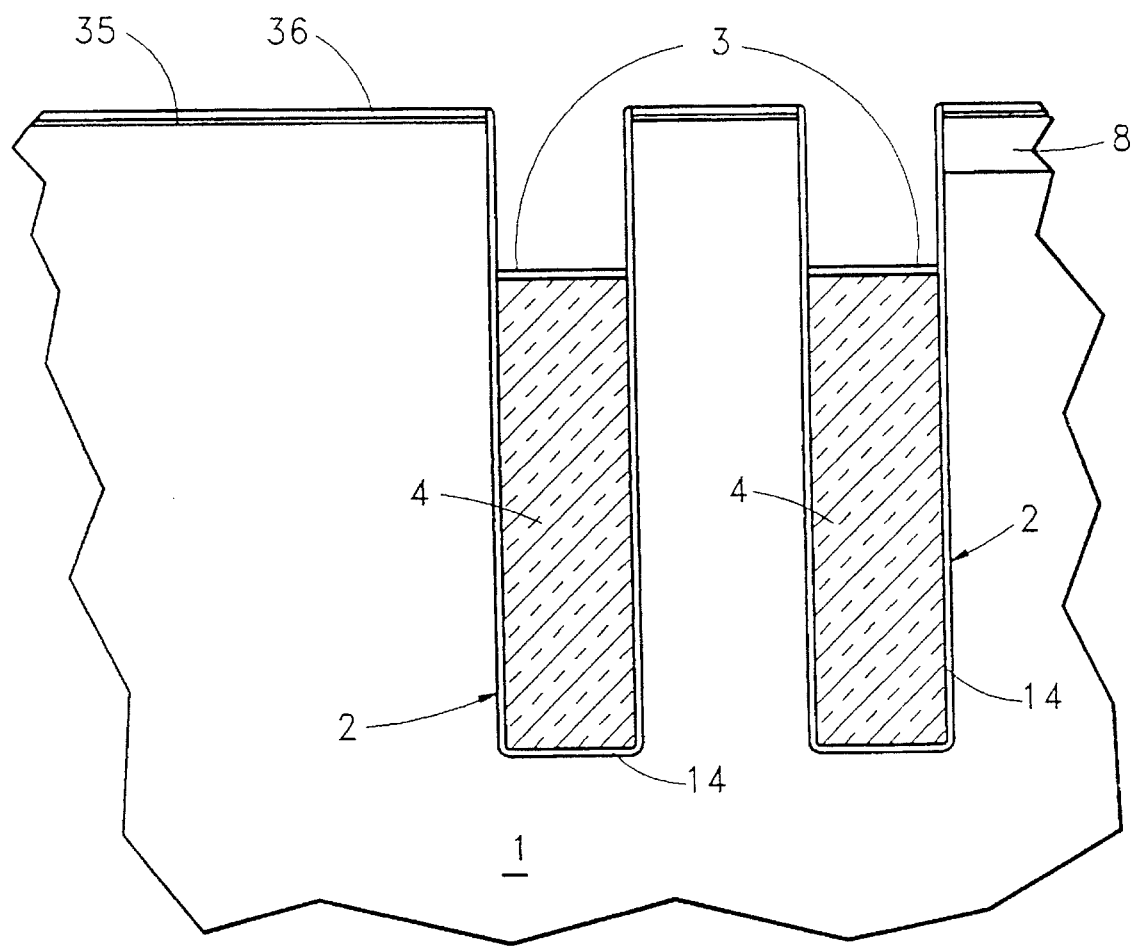
FIGS. 3–9 are sequential cross sectional views depicting the fabrication steps for constructing the cell of FIG. 1.

Referring now to FIG. 3, first LOCOS isolation layer 8 is formed on a planar substrate 1 by deposition. Next, pad oxide layer 35 (on the order of 100 angstroms) is grown on the surface of the substrate, followed by deposition of a nitride pad layer 36 (on the order of 200–500 angstroms) on the pad oxide layer. These pad layers act to protect the surface of the substrate during subsequent processing steps. Next, trenches 2 are etched, preferably by RIE (following the etching of the pad layers in the desired positions), into silicon substrate 1, to a depth sufficient to provide the desired storage capacitance. Capacitor dielectric 14, preferably composed of an oxide-nitride-oxide composite, is then formed inside the trenches in the following manner. First, a thin layer of oxide (not shown) is thermally grown on the entire structure by exposing the structure to oxygen at a high temperature. Next, a thin layer of nitride (preferably on the order of 50 angstroms) is deposited over the entire structure, followed by oxidation of that nitride layer. The trenches are then filled by blanketly depositing polysilicon over the entire structure, planarizing the polysilicon on the horizontal surfaces of the structure (by chem-mech polishing) and recessing the poly in the trenches to a desired depth using RIE. The polysilicon remaining in the trenches is poly fill 4. Next a thin nitride collar (on the order of several hundred angstroms) is formed around the upper portion of the interior of the trenches 2 by depositing a thin layer of nitride over the entire structure and anisotropically etching the deposited nitride layer to leave nitride only on the vertical walls of the trenches 2. The exposed polysilicon 4 in the trench is oxidized using thermal oxidation to form the cap oxide 3.

Figure 4:
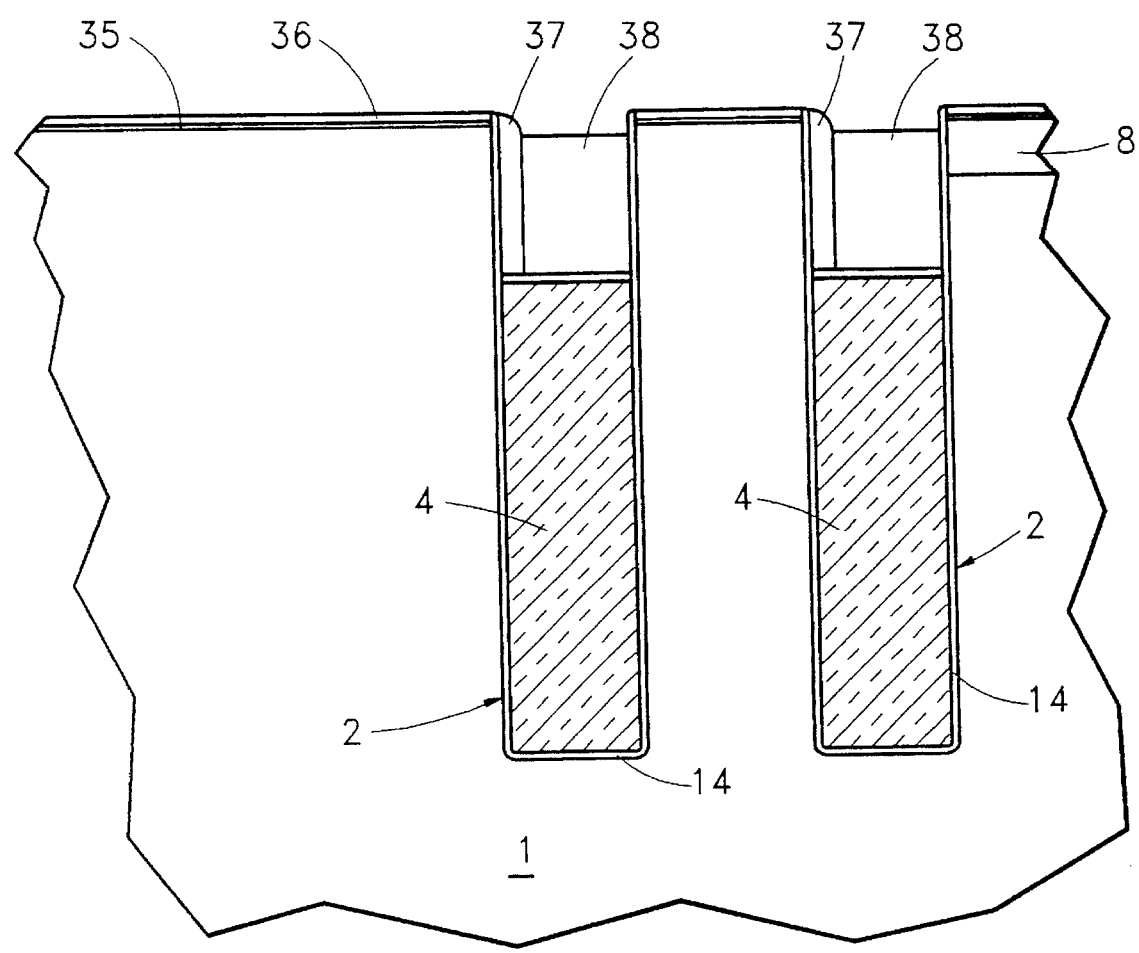

Referring to FIG. 4, an oxide collar 37 is now formed on the side of the trench 2 where the access device is to be formed. This is done by forming an oxide collar around the interior walls of the upper portion of the trench by first depositing a layer of oxide on the entire structure and then anisotropically etching (RIE) this oxide layer using a spacer mask to remove all but a segment of the collar. Planarization resist 38 is now spun on the wafer and recessed using a timed chemical etch, or RIE. The pad nitride 36 will be resistant to the etchant used to etch the planarization resist, and therefore the depth to which the resist is recessed below the surface of the device can be controlled without damage to the surface of the device. The resulting structure is shown in FIG. 4.

Figure 5:
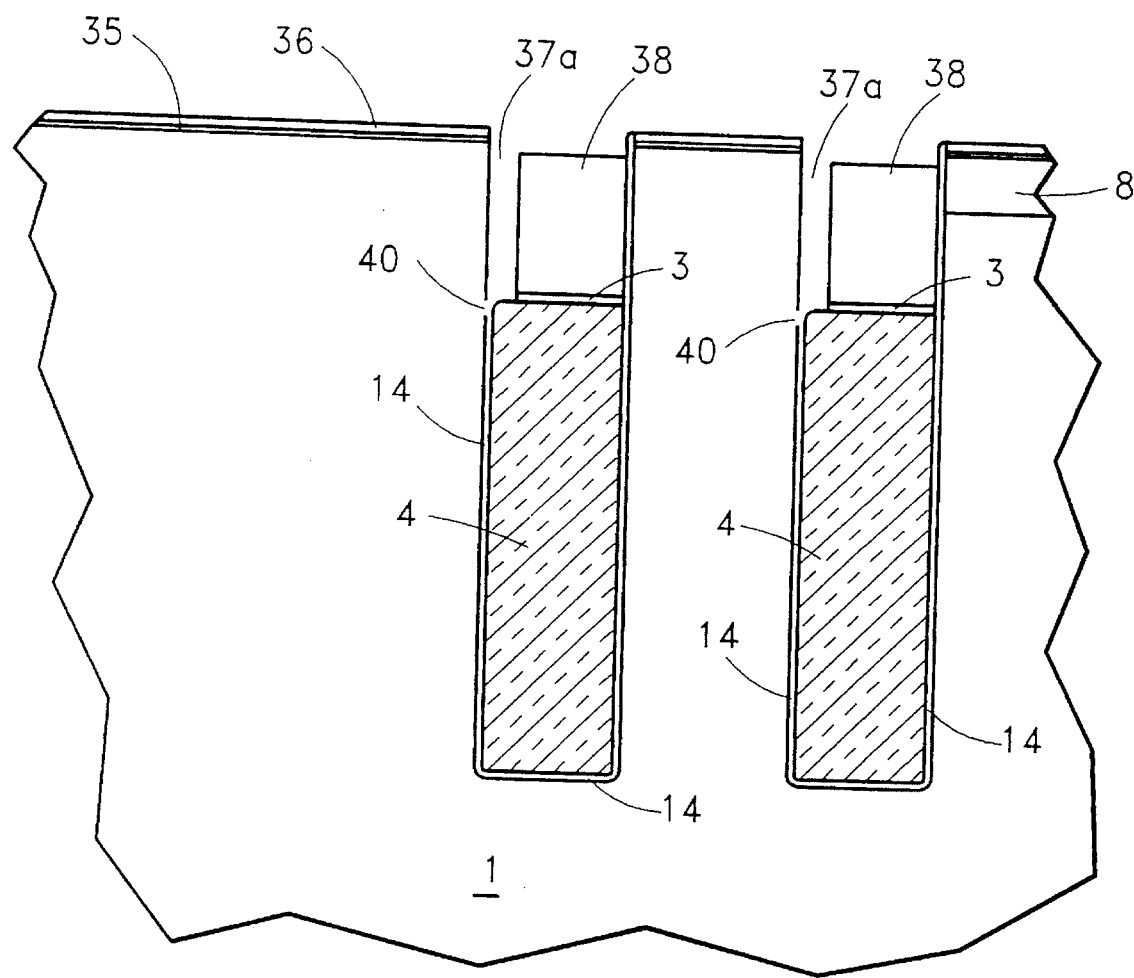
Figure 6:
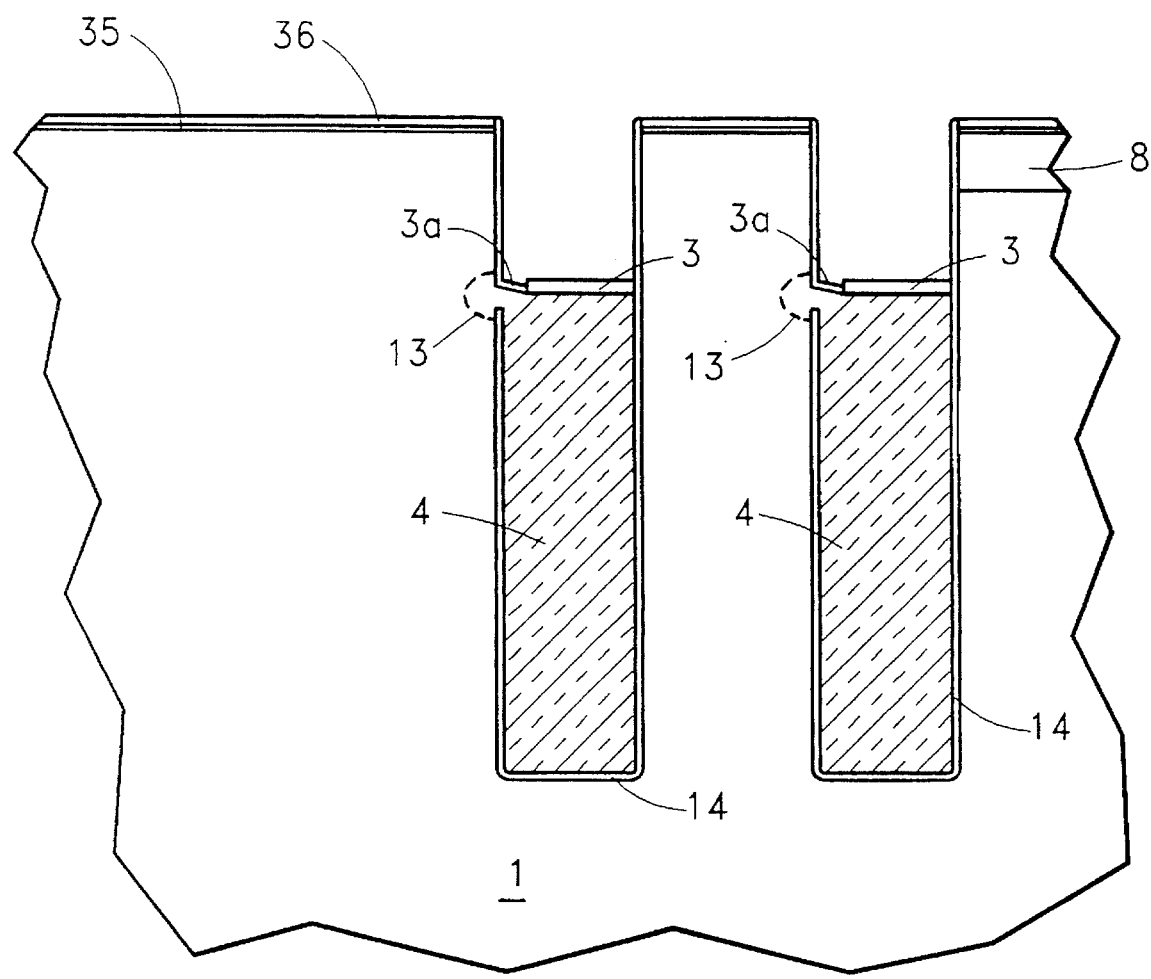

Next the oxide collar 37 is removed by means of a timed etch using hydrofluoric acid, leaving a gap 37a between the resist 38 and the wall of trench 2. A portion of oxide cap 3 is also removed during this step. The capacitor dielectric 14 exposed by the removal of the portion of cap oxide 3 is then over-etched to remove the capacitor dielectric to a level below the surface of the poly fill 4, preferably to a depth of about 100 nm from the upper surface of polysilicon 4, as shown in FIG. 5, thus forming an undercut to 40. The planarization resist 38 is then removed by means of any suitable solvent. A thin layer of intrinsic polysilicon is now deposited on the entire device, including inside the trenches 2 and particularly in the undercut 40, and then isotropically etched (RIE) to leave only undercut 40 filled with poly, thus forming the lateral storage node diffusion contact 13, as shown in FIG. 6. A thin sacrificial oxide layer is then formed by thermal oxidation inside the trench, resulting in a thickening of layer 3, and the addition of a thin layer 3a over the filled undercut 40, thus fully covering the upper surface of polysilicon 4.

Figure 7:
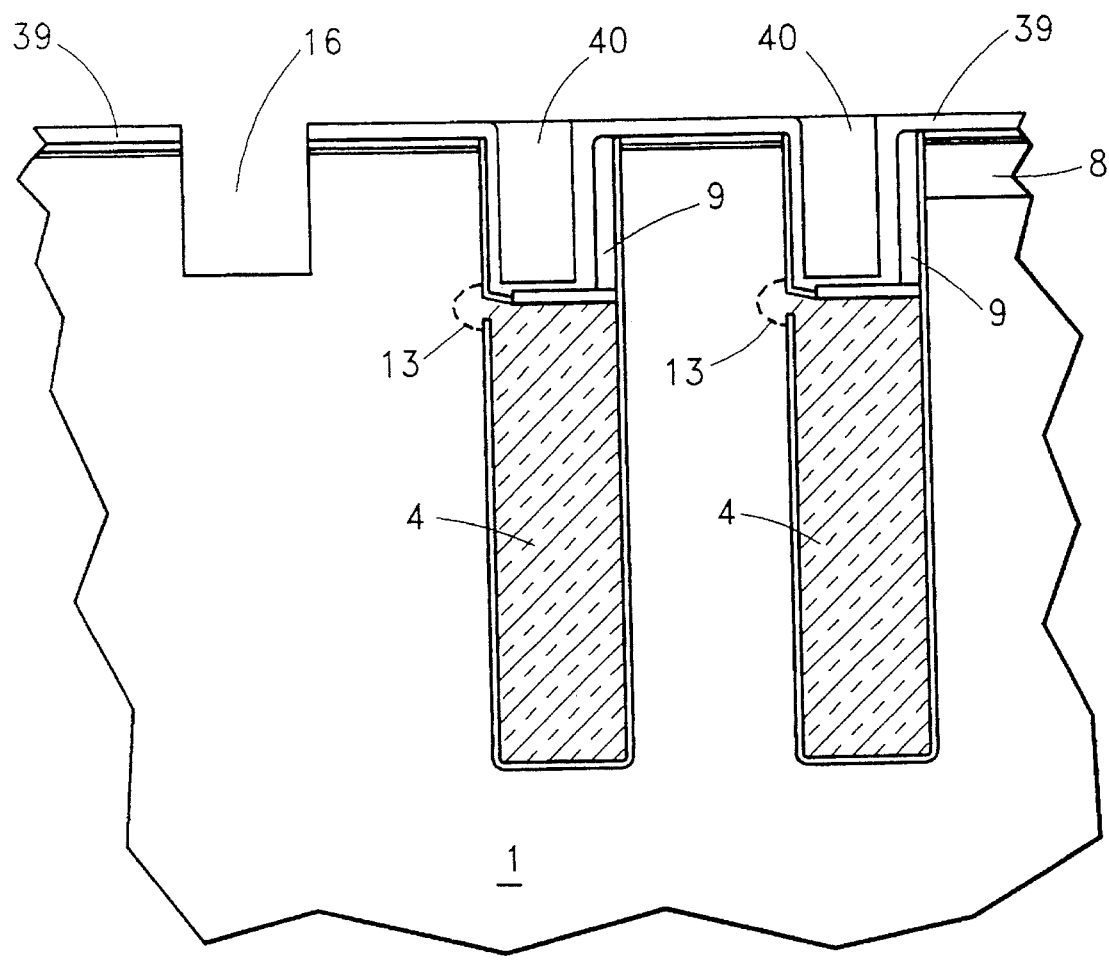
Figure 8:
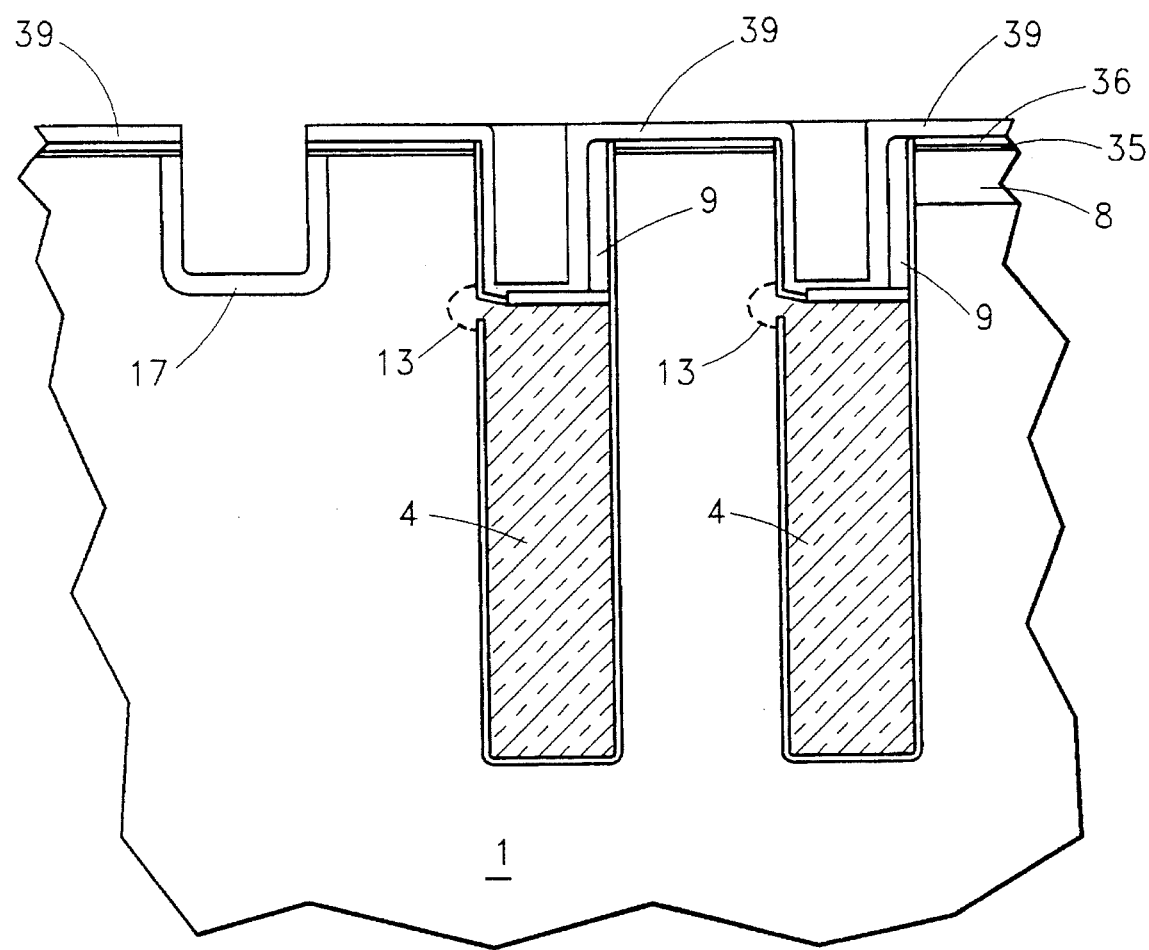

Referring to FIG. 7, an oxide collar is now formed in the trench, using a spacer mask as before, to leave an oxide spacer 9 on the wall of the trench opposite the access transistor 13. This oxide spacer acts as an isolation layer between the passing wordline (to be fabricated adjacent the oxide spacer in a subsequent step) and the substrate to prevent the thin oxide forming a portion of the dielectric on the wall of the trench from becoming "active". A thick layer of nitride 39 is blanketly deposited over the wafer, and a layer of planarization resist 40 is spun over the nitride layer 39. Using a shallow trench mask, shallow trenches 16 (shallower than trenches 2) are now etched between each pair of storage trenches (only one pair of which is shown in FIGS. 3–9), as shown in FIG. 7. The planarization resist 40 is now removed using a suitable solvent, and the exposed shallow trench is thermally oxidized to form a thick oxide lining 17, as shown in FIG. 8.

Figure 9:
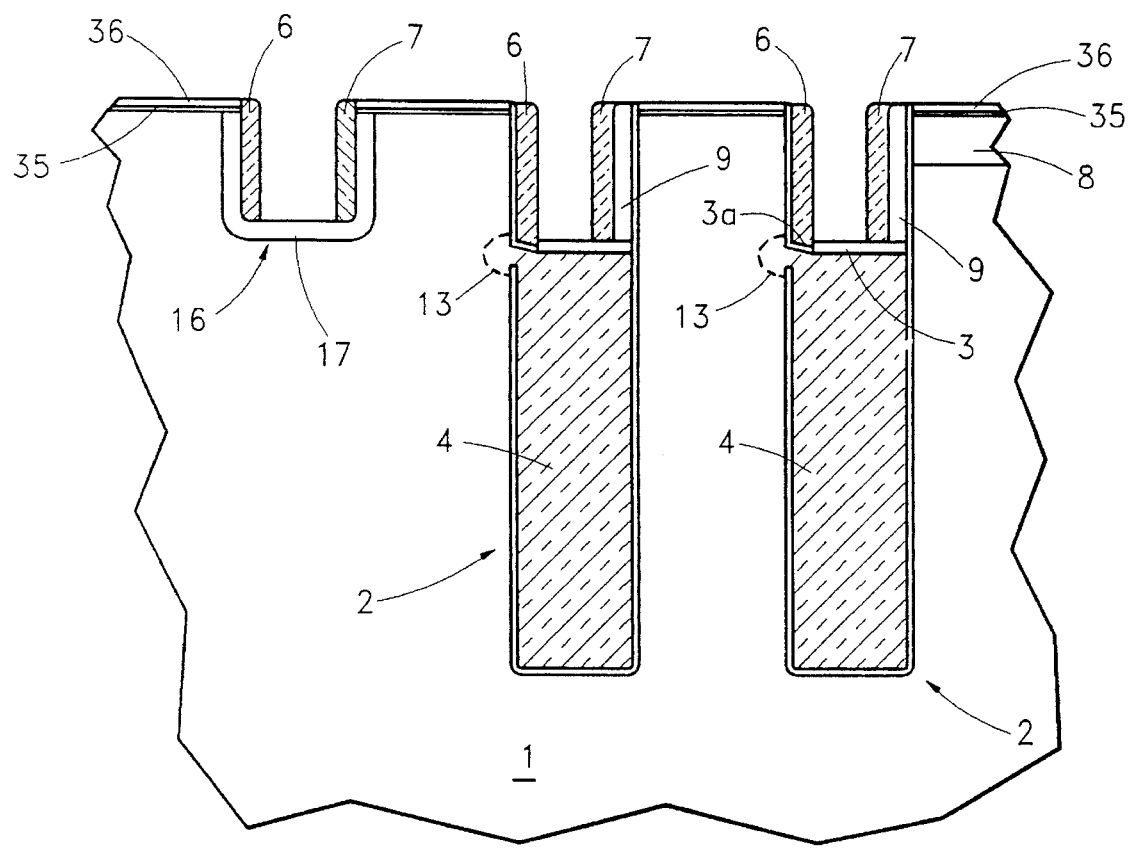

Referring to FIG. 9, the thick nitride layer 39 is now removed using hot phosphoric acid, and the oxide cap 3 and oxide 3a are etched to a depth sufficient to remove layer 3a, and the exposed portion of poly fill 4 is cleaned using any suitable cleaning technique known in the art. The structure is now thermally oxidized to form gate oxide 5 along the wall of the trench opposite the oxide spacer 9. Next, polysilicon is deposited on the structure, followed by anisotropic etching to form spacer wordlines 6 and 7 in trenches 2 and 16, as shown in FIG. 9.

Diffusion 18 is now formed in the surface of the substrate by means of ion implantation.

The pad nitride 36 and the pad oxide 35 (as well as the oxide-nitride-oxide composite) are now removed from the surface of the substrate using hot phosphoric acid and buffered hydrofluoric acid, respectively. A thick TEOS layer is now deposited on the entire structure. Contact holes are now etched in the TEOS, resulting in a TEOS layer having a cross-section as shown in FIG. 1 (oxide 10, 11 and 15), and bitlines 12 are then patterned to form the structure shown in FIG. 1.

While the invention has been described particularly with respect to a preferred embodiment thereof, it will be understood by those skilled in the art that modifications to the preferred embodiments can be effected by those skilled in the art without departing from the spirit and scope of the invention.

I claim:

1. A method for fabricating a folded bitline trench DRAM cell, comprising:

providing a substrate;

etching a first trench and a second trench into the substrate, the trenches each having walls;

lining the walls of the first and second trenches with a dielectric material;

partially filling the first and second trenches with polysilicon;

forming an insulating cap on an upper surface of the polysilicon in the first and second trenches;

in each of the first and second trenches, removing a portion of the insulating cap adjacent one of the walls;

forming first diffusion regions in the substrate proximate the removed portion of cap oxide;

forming second diffusion regions adjacent the side of each of the first and second trenches proximate the removed portion of the insulating cap and near the surface of the substrate;

forming a gate along the wall of each of the first and second trenches to connect the first and second diffusion areas proximate the respective trench;

forming a pair of wordlines in each of the first and second trenches;

forming a third trench in the substrate coupling a first trench in a column of cells with a second trench in the column;

forming wordlines on opposite walls of the third trench, the wordlines in the third trench coupling the wordlines of the first trench of the column with the wordlines of the second trench of the column.

2. The method of claim 1, further comprising forming an oxide spacer on a wall of each of the first and second trenches opposite the gate, wherein the oxide spacer is disposed between one of the wordlines in each of the first and second trenches and the wall opposite the gate.

3. The method of claim 1, wherein the wordlines in each trench are vertically disposed.

4. The method of claim 1, wherein the insulating cap is formed on the upper surface of the polysilicon in the first and second trenches by thermal oxidation of the upper surface of the polysilicon.

5. The method of claim 1, wherein the second diffusion region is formed by ion implantation.

6. The method of claim 1, wherein the pair of wordlines is formed by depositing polysilicon in the first and second trenches and anisotropically etching horizontal portions of the deposited polysilicon, leaving vertically disposed wordlines on the opposite walls of the trench.

* * * * *